(12) United States Patent
Sekino et al.

(10) Patent No.: US 9,825,100 B2
(45) Date of Patent: Nov. 21, 2017

(54) NONVOLATILE SEMICONDUCTOR MEMORY DEVICE (71) Applicant: TOSHIBA MEMORY CORPORATION, Minato-ku (JP)

(72) Inventors: Yuki Sekino, Yokohama (JP); Takashi Izumida, Yokohama (JP); Nobutoshi Aoki, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/011,759

(22) Filed: Feb. 1, 2016

(65) Prior Publication Data

US 2017/0062523 A1 Mar. 2, 2017

Related U.S. Application Data (60) Provisional application No. 62/212,117, filed on Aug. 31, 2015.

(51) Int. Cl.
*H01L 27/24* (2006.01)
*H01L 23/532* (2006.01)
(Continued)

(52) U.S. Cl.
CPC ............ *H01L 27/249* (2013.01); *G11C 5/063* (2013.01); *H01L 23/528* (2013.01);
(Continued)

(58) Field of Classification Search
CPC . H01L 27/249; H01L 27/2454; H01L 23/528; H01L 45/08; H01L 45/1233;
(Continued)

(56) References Cited

U.S. PATENT DOCUMENTS 8,912,521 B2 12/2014 Nojiri et al.
2013/0292630 A1* 11/2013 Sasago ................ H01L 27/2454
257/4

(Continued)

FOREIGN PATENT DOCUMENTS

JP 2014-103373 6/2014
JP 2015-19048 1/2015

*Primary Examiner* — Cuong B Nguyen
*Assistant Examiner* — Juanita Rhodes
(74) *Attorney, Agent, or Firm* — Oblon, McClelland, Maier & Neustadt, L.L.P.

(57) ABSTRACT

According to one embodiment, a nonvolatile semiconductor memory device includes a plurality of conducting layers, a semiconductor layer, a variable resistive element, and a first wiring. The plurality of conducting layers are laminated in a first direction at predetermined pitches. The conducting layers extend in a second direction. The second direction is along the surface of the substrate. The semiconductor layer extends in the first direction. The variable resistive element is disposed at an intersection point between the plurality of conducting layers and the semiconductor layer. The first wiring is opposed to an inside of the semiconductor layer via a gate insulating film. The first wiring extends in the first direction. The semiconductor layer at least includes a first part and a second part. The first part is upward of the conducting layer on a lowermost layer. The second part is downward of the first part. The first part has a first length in a third direction. The third direction is intersecting the first direction and the second direction, and is along the surface of the substrate. The second part has a second length in the third direction. The second length is shorter than the first length.

12 Claims, 13 Drawing Sheets (51) Int. Cl.
 *H01L 45/00* (2006.01)
 *H01L 23/528* (2006.01)
 *G11C 5/06* (2006.01)

(52) U.S. Cl.
 CPC .. *H01L 23/53257* (2013.01); *H01L 23/53271* (2013.01); *H01L 27/2454* (2013.01); *H01L 45/08* (2013.01); *H01L 45/1233* (2013.01); *G11C 2213/32* (2013.01); *G11C 2213/71* (2013.01); *G11C 2213/78* (2013.01); *G11C 2213/79* (2013.01)

(58) Field of Classification Search
 CPC ......... H01L 23/53271; H01L 23/53257; G11C 5/063; G11C 13/0007; G11C 13/0097; G11C 13/0028; G11C 13/0069; G11C 13/0026; G11C 2213/79; G11C 2213/32; G11C 2013/0078; G11C 2213/71; G11C 2213/75
 See application file for complete search history.

(56) References Cited

U.S. PATENT DOCUMENTS

2014/0268996 A1* 9/2014 Park .................. H01L 45/04
 365/148
2015/0014622 A1 1/2015 Kanno et al.

* cited by examiner

NONVOLATILE SEMICONDUCTOR MEMORY DEVICE

CROSS REFERENCE TO RELATED APPLICATION

This application is based upon and claims the benefit of priority from U.S. Provisional Patent Application No. 62/212,117, filed on Aug. 31, 2015, the entire contents of which are incorporated herein by reference.

FIELD

Embodiments described herein relate generally to a nonvolatile semiconductor memory device.

BACKGROUND

Recently, in association with highly integrated semiconductor memory devices, LSI devices constituting these semiconductor memory devices have been increasingly miniaturized. For miniaturization of these LSI devices, not only simply thinning the line width, but also improvements in dimensional accuracy and position accuracy of a circuit pattern are desired. As a technique to overcome such problem, there has been proposed a Resistive RAM (ReRAM) that uses variable resistive elements, which reversibly change a resistance value, as a memory. This ReRAM includes the variable resistive element between a sidewall of a word line extending parallel to a substrate and a sidewall of a bit line extending perpendicular to the substrate. This three-dimensional structure ensures further highly integrated memory cell array. With this three-dimensional-structured ReRAM, On/Off of each bit line is required to be accurately controlled.

DETAILED DESCRIPTION

A nonvolatile semiconductor memory device according to an embodiment described later includes a plurality of conducting layers, a semiconductor layer, a variable resistive element, a semiconductor layer, and a first wiring. The conducting layers are laminated in a first direction at predetermined pitches. The conducting layers extend in a second direction along the surface of the substrate. The semiconductor layer extends in the first direction. The variable resistive element is disposed at an intersection point between the plurality of conducting layers and the semiconductor layer. The semiconductor layer is in contact with side surfaces of the plurality of conducting layers via the variable resistive element. The semiconductor layer extends in the first direction. The first wiring is opposed to an inside of the semiconductor layer via a gate insulating film. The first wiring extends in the first direction. The semiconductor layer at least includes a first part and a second part. The first part is upward of the conducting layer on a lowermost layer. The second part is downward of the first part. The first part has a first length in a third direction. The third direction is intersecting the first direction and the second direction, and along the surface of the substrate. The second part has a second length in the third direction. The second length is shorter than the first length.

[First Embodiment]
[Configuration]

Figure 1:
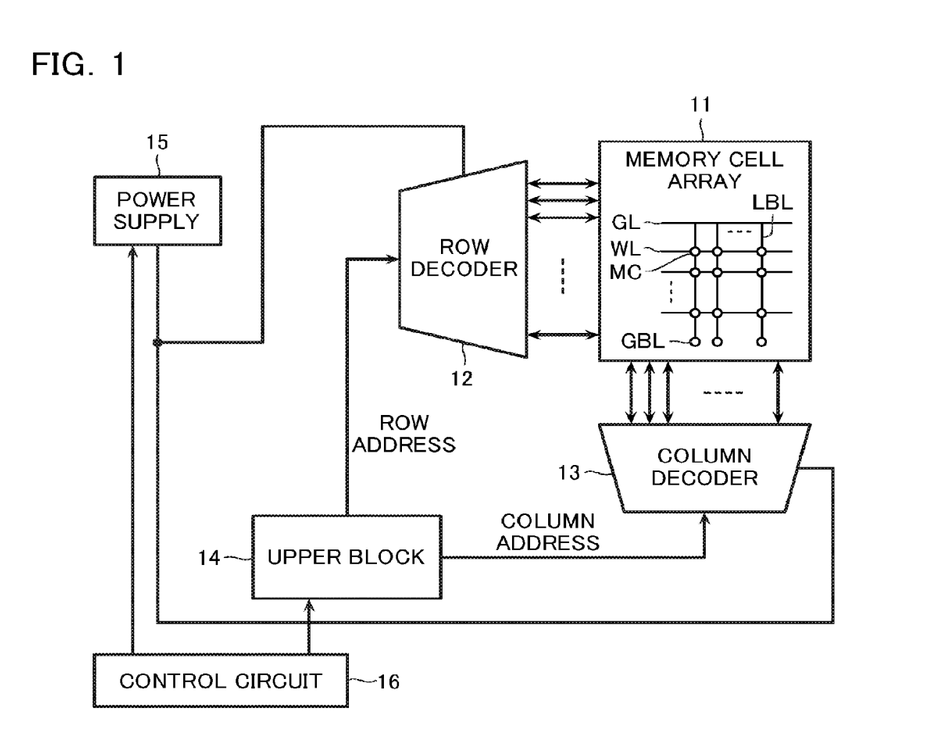
FIG. 1 is an exemplary block diagram of a semiconductor memory device according to a first embodiment.

The following describes an overall configuration of a semiconductor memory device according to the first embodiment with reference to FIG. 1. FIG. 1 is an exemplary block diagram of a nonvolatile semiconductor memory device according to a first embodiment. As illustrated in FIG. 1, the nonvolatile semiconductor memory device includes a memory cell array 11, a row decoder 12, a column decoder 13, an upper block 14, a power supply 15, and a control circuit 16.

The memory cell array 11 includes a plurality of word lines WL and local bit lines LBL, which intersect with one another, and memory cells MC, which are disposed in the respective intersection portions of these lines.

The local bit line LBL is electrically connected to a gate line GL via a gate electrode GE. The lower end of the local bit line LBL is electrically connected to a global bit line GBL. The row decoder 12 selects the word line WL and the local bit line LBL for access (data erasure/writing/reading). The column decoder 13 includes a driver that selects the global bit line GBL for access to control an access operation.

The upper block 14 selects the memory cell MC in the memory cell array 11 to be accessed. The upper block 14 gives a row address and a column address to the row decoder 12 and the column decoder 13, respectively. The power supply 15 generates combinations of predetermined voltages corresponding to the respective operations of data erasure/writing/reading and supplies the combinations to the row decoder 12 and the column decoder 13. The control circuit 16 performs a control such as transmission of an address to the upper block 14 in response to an external command and controls the power supply 15.

Figure 2:
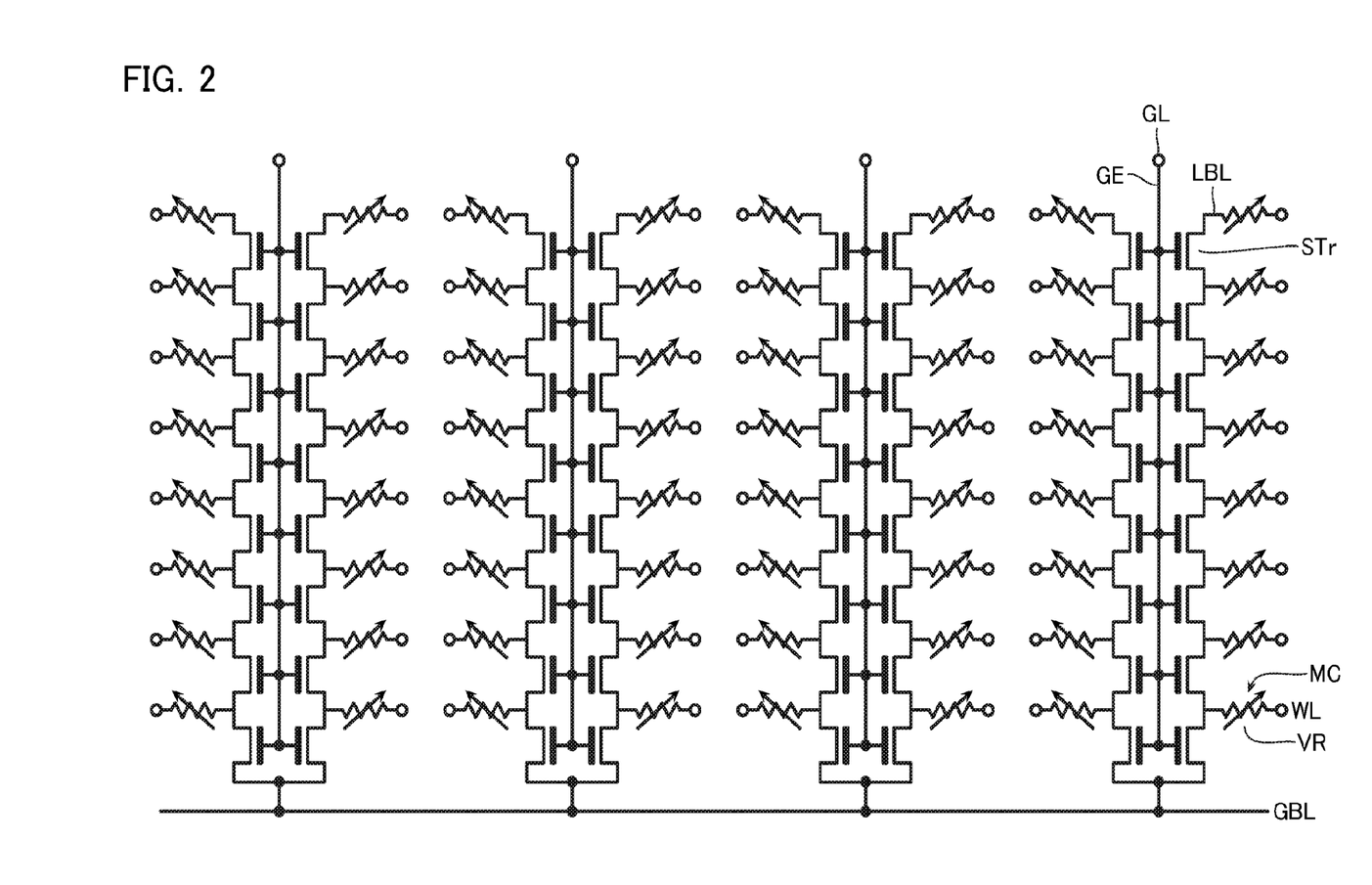
FIG. 2 is an exemplary circuit diagram of a memory cell array 11 according to the first embodiment.

Next, the following describes a circuit configuration of the memory cell array 11 in the embodiment using FIG. 2, which illustrates an exemplary equivalent circuit diagram of the memory cell array 11.

As illustrated in FIG. 2, the plurality of memory cells MC are disposed in the memory cell array 11 of the embodiment. The memory cells MC are disposed at intersection portions of the word lines WL and the local bit lines LBL. The nonvolatile semiconductor memory device of the embodiment includes a plurality of the configurations illustrated in FIG. 2 both in the horizontal direction on the paper and the vertical direction on the paper.

The memory cell MC includes a variable resistive element VR. The variable resistive element VR is electrically rewritable and stores data in a non-volatile manner based on the resistance value. The variable resistive element VR changes from a high resistance state (a reset state) to a low resistance state (a setting state) by a setting operation. The setting operation applies a voltage at a certain magnitude or more to both ends of the variable resistive element VR. The variable resistive element VR changes from the low resistance state (the setting state) to the high resistance state (the reset state) by a reset operation. The reset operation applies a voltage at a certain magnitude or more to both ends of the variable resistive element VR. Immediately after the manufacture, the variable resistive element VR is in a state of not easily changing its resistive state and in the high resistance state. Therefore, a forming operation, which applies a high voltage equal to or more than the setting operation and the reset operation to both ends of the variable resistive element VR, is performed. This forming operation forms a region where a current is likely to locally flow in the variable resistive element VR (a filament path). This allows the variable resistive element VR to easily change the resistive state, being operable as a storage element.

To access the one selected memory cell MC, the column decoder 13 selects the local bit line LBL connected to the selected memory cell MC. That is, a predetermined voltage is applied to the gate line GL electrically connected to the selected local bit line LBL. Simultaneously, a voltage of a value different from the voltage applied to the gate line GL is applied to the global bit line GBL connected to the selected memory cell MC. Then, a potential difference between the gate electrode GE, which is electrically connected to the gate line GL, and the global bit line GBL, which is electrically connected to the local bit line LBL, generates an inversion layer on the local bit line LBL. This forms a channel (a current path). That is, the selection transistor STr illustrated in FIG. 2 enters in the On state. Thus, with the nonvolatile semiconductor memory device of the embodiment, the gate electrode GE, the local bit line LBL, and the gate insulating film (described later, not illustrated in FIG. 2) constitute the selection transistor STr. The gate insulating film is interposed between the gate electrode GE and the local bit line LBL. The selection transistor STr employs the gate electrode GE as the gate and the local bit line LBL as a channel. A predetermined voltage is applied to the word line WL connected to the selected memory cell MC. Then, the potential difference between these word line WL and global bit line GBL causes a current to flow, allowing access to the memory cell MC. A predetermined voltage is applied to the word line WL connected to the non-selected memory cell MC. This causes the current not to flow in the non-selected memory cell MC.

Figure 3:
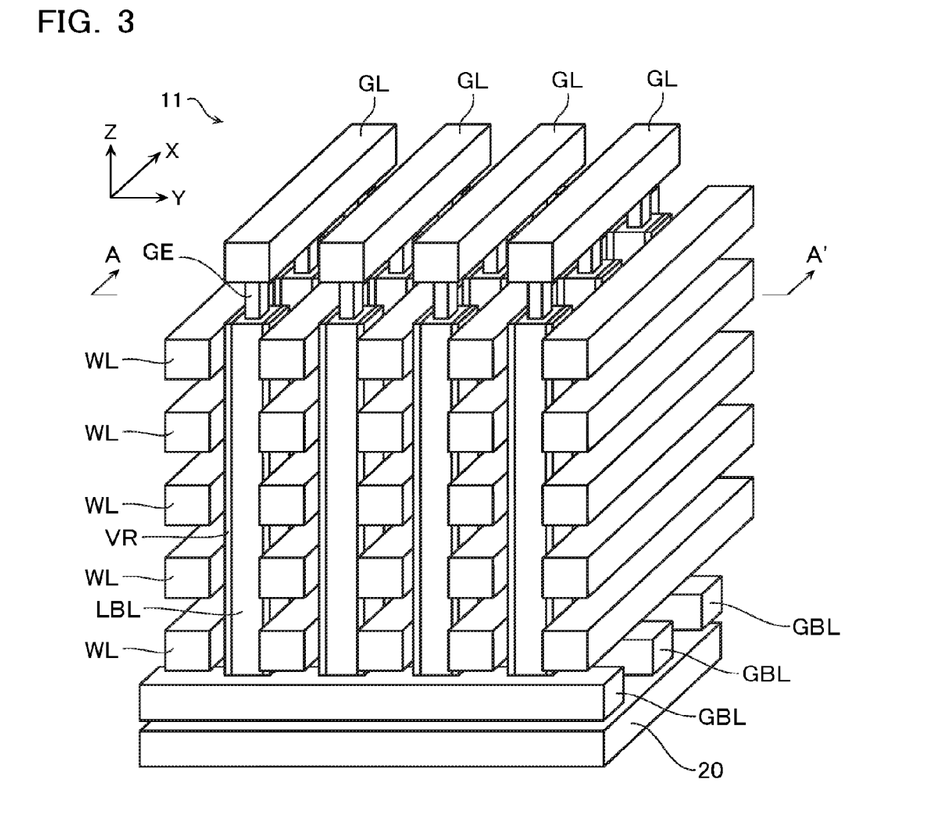
FIG. 3 is an exemplary perspective view illustrating a laminated structure of the memory cell array 11 according to the first embodiment.
Figure 4A:
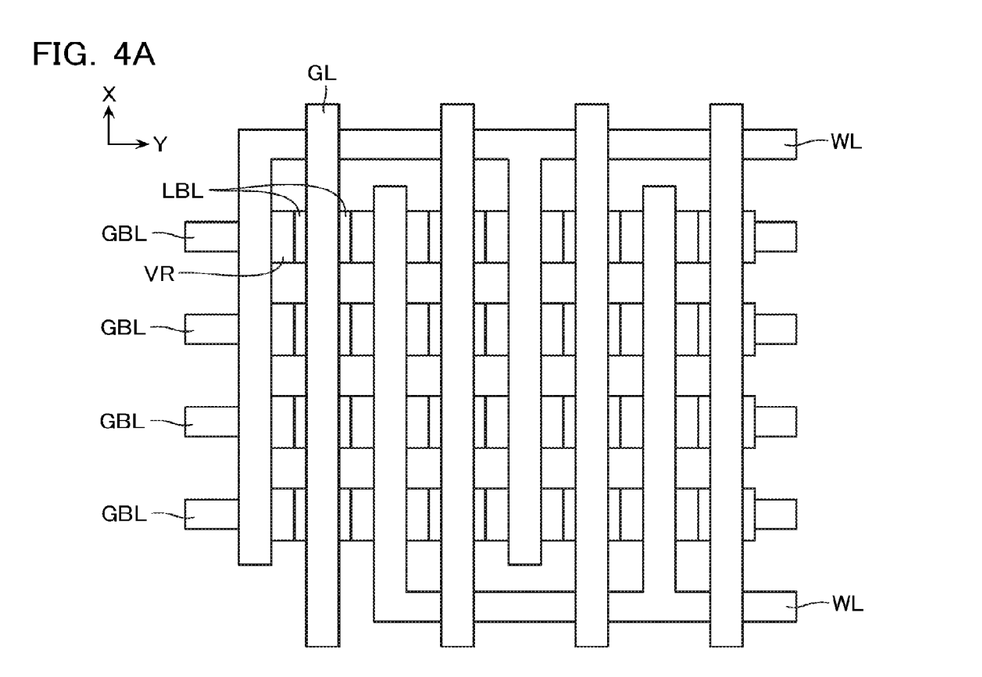
FIG. 4A and FIG. 4B are top view and cross-sectional view illustrating the configuration of the memory cell array 11 according to the first embodiment.
Figure 4B:
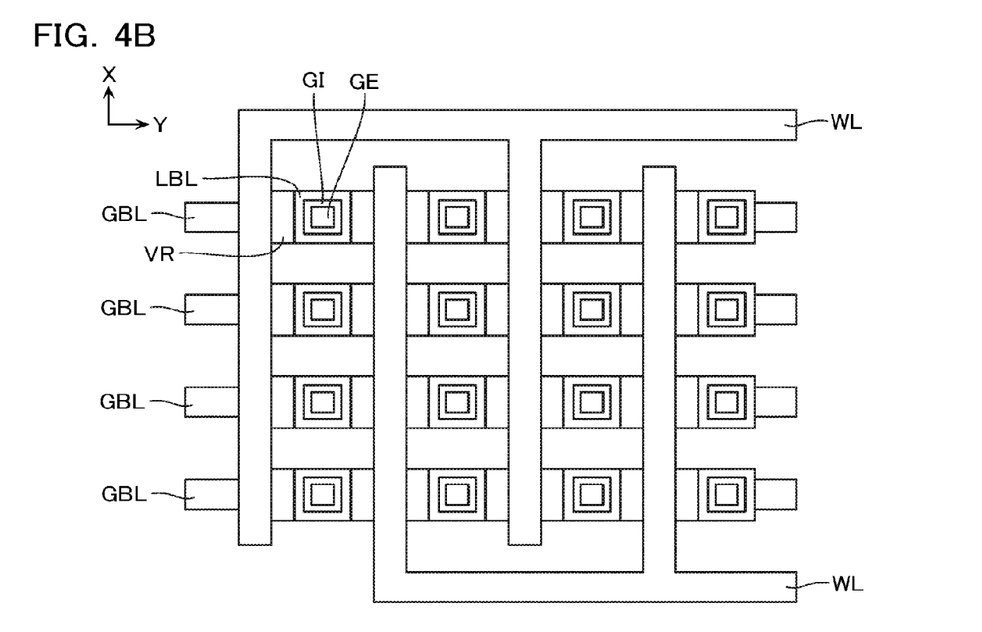

The following describes the schematic configuration of the memory cell array 11 according to the first embodiment with reference to FIG. 3, FIG. 4A, and FIG. 4B. FIG. 3 is a perspective view illustrating an exemplary laminated structure of the memory cell array 11. FIG. 4A is a schematic top view of the memory cell array 11 whose top surface is viewed from a Z direction. FIG. 4B is a cross-sectional view taken along the line A-A' of FIG. 3.

As illustrated in FIG. 3, the memory cell arrays 11 are laminated in the Z direction, which is perpendicular to a substrate 20, at predetermined pitches. The memory cell arrays 11 include the plurality of word lines WL. The word lines WL are parallel to the surface of the substrate 20 and extend in the X direction. The plurality of word lines WL are disposed in the Y direction, which is perpendicular to the X direction. As illustrated in FIG. 4A and FIG. 4B, the word lines WL are formed into a comb shape viewed from the Z direction.

The word line WL, for example, made of titanium nitride.

On the side surfaces of the word lines WL in the Y direction, the variable resistive elements VR, which extend in the Z direction, are disposed. The variable resistive element VR is, for example, made of a metal oxide film such as hafnium oxide (HfOx). The thickness of the variable resistive element VR is, for example, around 5 nm. However, the thickness can be appropriately changed in the range of around 2 to 10 nm. As materials other than HfOx, a transition metal oxide such as tantalum oxide (TaOx) can be used. The variable resistive element VR is disposed in common across the plurality of word lines WL in FIG. 3. However, the variable resistive elements VR may be constituted so as to be separately disposed for each of the word lines WL.

As illustrated in FIG. 3, FIG. 4A, and FIG. 4B, the columnar-shaped local bit lines LBL, which extend in the Z direction, are disposed on the side surfaces of the variable resistive elements VR on the opposite side from the word lines WL. That is, the local bit lines LBL are in contact with the word lines WL via the variable resistive elements VR. The local bit lines LBL are disposed in a matrix in the X direction and the Y direction. The local bit line LBL is formed of a semiconductor.

The semiconductor, which constitutes the local bit line LBL, may be made of polysilicon to which impurities such as phosphorus (P), boron (B), or arsenic (As) is added, as well as polysilicon to which impurities are not added.

With the nonvolatile semiconductor memory device of the embodiment having the above-described configuration, the memory cells MC including the variable resistive elements VR are disposed at the portions (the intersection points) where the word lines WL intersect with the local bit lines LBL. Therefore, the memory cell MC has a three-dimensional matrix structure disposed along the respective X, Y, and Z directions.

In the embodiment, as illustrated in FIG. 4A and FIG. 4B, the planar shape of the local bit line LBL is a rectangular shape. Regarding the relationship between lengths of this rectangular shape in the X direction and the Y direction, either one of the length may be longer than the other or both may have the identical length. The planar shape of the local bit line LBL is not limited to the rectangular shape but may be a circular shape.

As illustrated in FIG. 3, to the lower ends of the local bit lines LBL in the Z direction, the global bit lines GBL are connected. The global bit lines GBL extend in the Y direction and are disposed on the substrate 20 in the X direction at predetermined pitches.

The global bit line GBL is, for example, made of metal such as tungsten (W).

As illustrated in FIG. 3 and FIG. 4A, the selection gate lines GL are disposed upward more than word line WL on the uppermost layer. The selection gate lines GL extend in the X direction at predetermined pitches in the Y direction. The material that can be used for the selection gate line GL is similar to the word line WL.

As illustrated in FIG. 3 and FIG. 4B, the gate electrode GE is disposed inside the columnar-shaped local bit line LBL. The gate electrodes GE extend in the Z direction via gate insulating films GI. That is, the inner side surfaces of the local bit line LBL are opposed to the side surfaces of the gate electrode GE via the gate insulating film GI. The gate electrode GE, for example, can be made of n+ type polysilicon with high concentration and titanium nitride (TiN).

The upper end of the gate electrode GE is electrically connected to the gate line GL.

Although details are described later, the local bit line LBL in the embodiment includes a first part and a second part. The first part is disposed upward of the word line WL positioned on the lowermost layer. The first part has a first length D1 in the Y direction. The second part is disposed downward of the first part. The second part has a second length D2 in the Y direction whose length is shorter than the first length.

Figure 5:
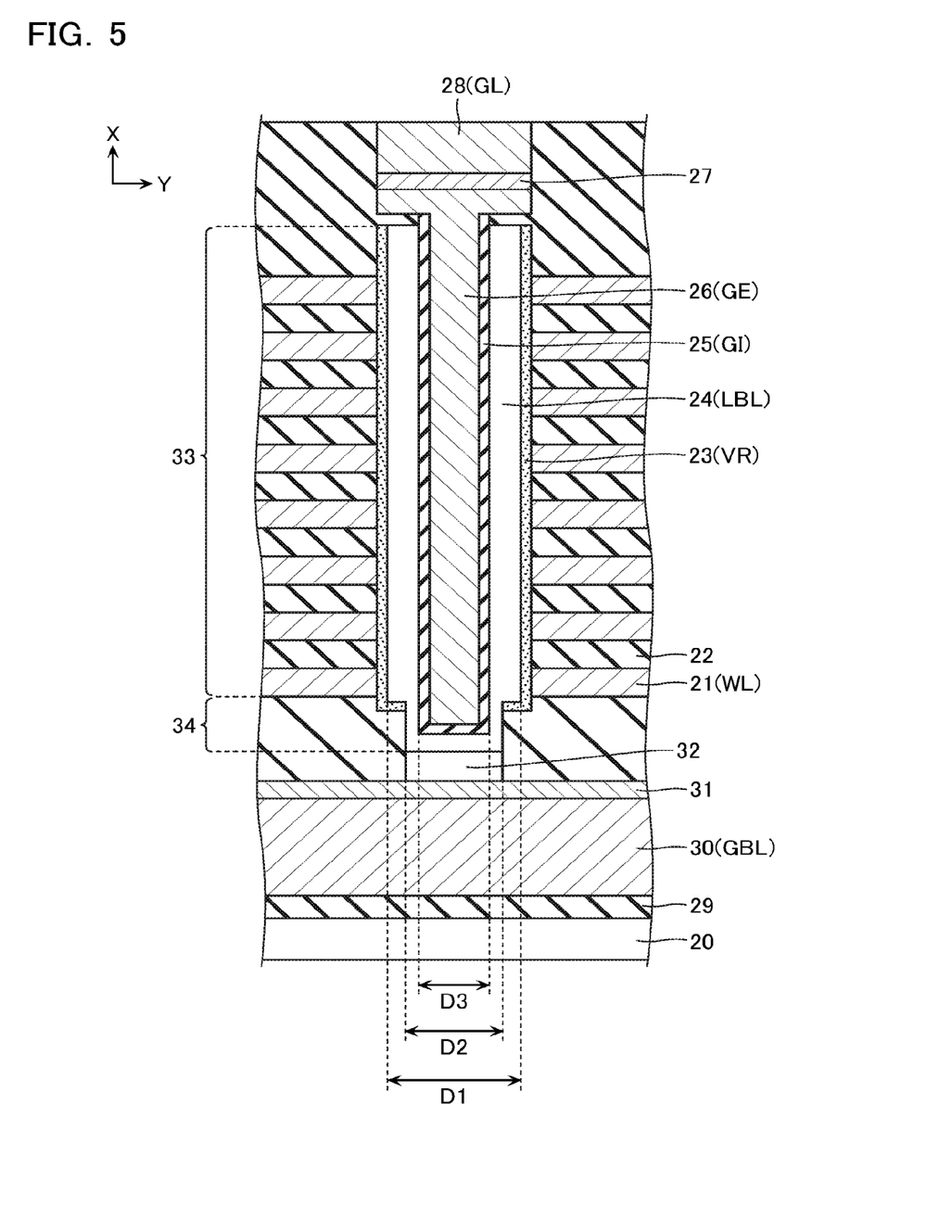
FIG. 5 is a schematic cross-sectional view illustrating a part including a plurality of memory cells MC of the memory cell array 11 according to the first embodiment.

The following describes the laminated structure of the memory cell arrays 11 according to the first embodiment using the cross-sectional view of FIG. 5.

FIG. 5 is a schematic cross-sectional view illustrating a part including the plurality of memory cells MC of the memory cell array 11.

As illustrated in FIG. 5, in the embodiment, interlayer insulating layers 22 and conducting layers 21 are laminated in alternation on the substrate 20 in the Z direction. Variable resistance films 23 are disposed in common on the end side surfaces of these conducting layers 21 in the Y direction. In the embodiment, the conducting layer 21 on the lowermost layer may not function as the word line WL but may be treated as a so-called dummy word line.

The interlayer insulating layer 22 is, for example, can be made of an insulating material such as silicon oxide (SiO). The conducting layer 21 functions as the word line WL. The conducting layer 21 can be made of the above-described materials for the word line WL. The variable resistance film 23 functions as the variable resistive element VR. The variable resistance film 23 can be made of the above-described materials for the variable resistive element VR.

A semiconductor layer 24 is disposed on the side surfaces of the variable resistance films 23 on the opposite side from the conducting layers 21. The semiconductor layer 24 extends in the Z direction and has a columnar shape. This semiconductor layer 24 functions as the local bit line LBL. The materials constituting the semiconductor layer 24 are similar to the above-described materials constituting the local bit line LBL.

A core-like conducting layer 26 is disposed inside the columnar-shaped semiconductor layer 24 via the gate insulating layer 25. The core-like conducting layer 26 does not penetrate up to the lower end of the semiconductor layer 24. Consequently, the semiconductor layer 24 is formed into a U shape viewed from the Y-Z cross section. This conducting layer 26 functions as the gate electrode GE. The materials constituting the conducting layer 26 are similar to the above-described materials for the gate electrode GE. The conducting layer 26 is connected to a conducting layer 28 via a barrier layer 27 upward of the word line WL on the uppermost layer. Similar to the word line WL, the conducting layer 28 extends in the X direction. The conducting layer 28 functions as the selection gate line GL. The barrier layer 27 is made of titanium nitride or a similar material.

The lower end of the semiconductor layer 24 is connected to a conducting layer 30 via a conducting layer 32 and a barrier layer 31. The conducting layer 30 is disposed on the substrate 20 via an insulating film 29. The barrier layer 31 is made of titanium nitride or a similar material. The barrier layer 31 functions as a barrier metal to prevent a diffusion of impurities or a similar material to the conducting layer 30. The conducting layer 32 is made of n+ type polysilicon or a similar material. The conducting layer 32 causes the conducting layer 30 to be in ohmic contact with the semiconductor layer 24. The semiconductor layer 24 in the first embodiment at least includes a first part 33 and a second part 34. The first part 33 is disposed upward of the conducting layer 21 (the word line WL) on the lowermost layer. The first part 33 has the first length D1 in the Y direction. The second part 34 is disposed downward of the first part 33. The second part 34 has the second length D2 in the Y direction shorter than the first length D1.

In the embodiment, the first length D1 in this Y direction is approximately identical to a distance between the opposed variable resistance films 23. The second length D2 in the Y direction is shorter than this first length D1. The second length D2 is longer than the third length D3 in the Y direction, which is the length adding the conducting layer 26 and the gate insulating layer 25.

Thus, in the embodiment, the length of the second part 34, which is positioned at least downward more than the conducting layer 21 on the lowermost layer of the semiconductor layer 24, is configured shorter than the first part 33, which is positioned at least upward more than the conducting layer 21 on the lowermost layer, in the Y direction. This thins a current path (a channel) between the conducting layer 30 (the global bit line GBL) and the conducting layer 21 (the word line WL). Therefore, a resistance of the part at which the channel of this second part 34 is thinned increases compared with the resistance of the first part 33. This restrains a leak current between the conducting layer 30 (the global bit line GBL) and the conducting layer 21 (the word line WL).

In the embodiment, as illustrated in FIG. 5, the variable resistance films 23 are disposed at both the side surfaces and the bottom portions of the first part 33 of the semiconductor layer 24. That is, the variable resistance film 23 has the part extending in the Y direction at the bottom portion of the first part 33 of the semiconductor layer 24. However, the disposition is not limited to this. The parts may be disposed on the side surfaces of the second part 34 and may not be disposed on the bottom portions of the first part 33. In other words, it is only necessary that the variable resistance film 23 be disposed on the side surfaces of the conducting layer 21. In association with short diameter (D2) of the second part 34, the diameter of the conducting layer 32 is also short. However, this should not be constructed in a limiting sense. The diameter of the conducting layer 32 may be similar extent to the diameter (D1) of the first part 33.

[Manufacturing Method]

The following describes a method for manufacturing the nonvolatile semiconductor memory device according to the first embodiment with reference to FIG. 6 to FIG. 11. The following omits a description of an interlayer insulating layer, which is disposed at the conducting layer 30 (the global bit line GBL), the barrier layer 31, and the conducting layer 32 and above/below the conducting layer 30, the barrier layer 31, and the conducting layer 32.

Figure 6:
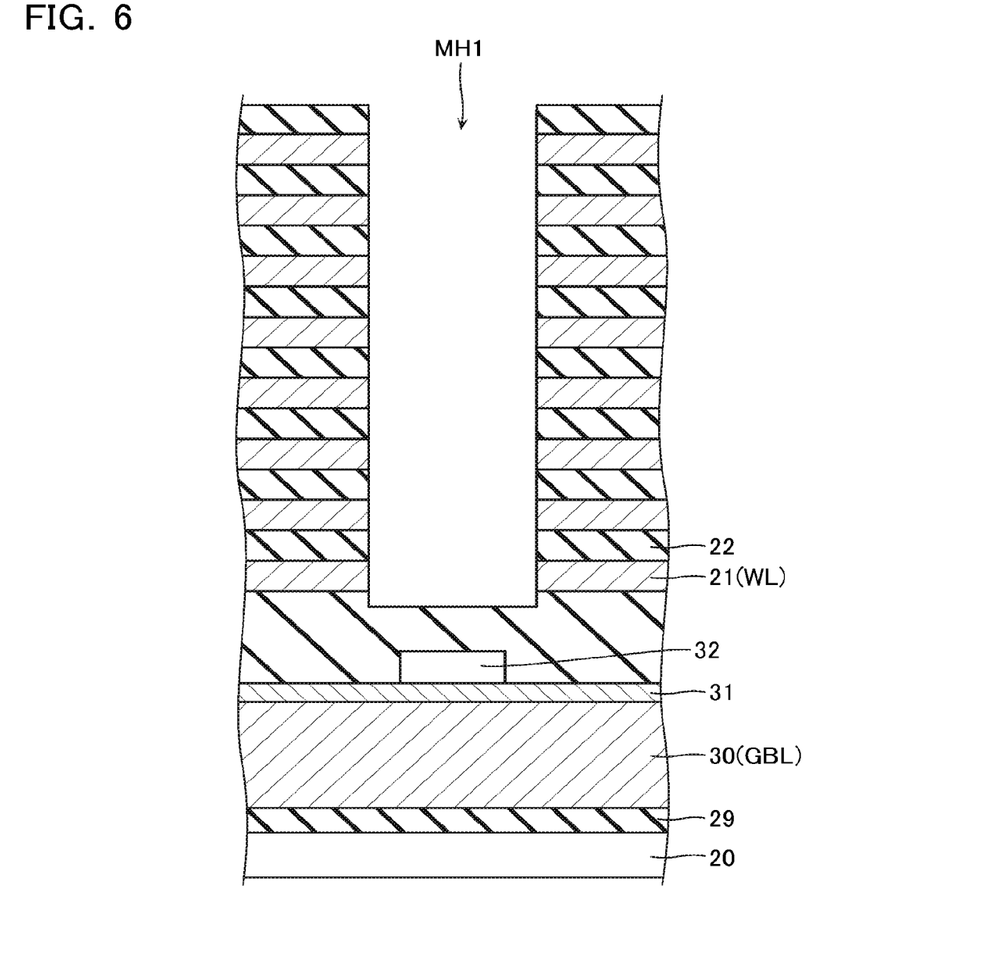
FIG. 6 to FIG. 11 are exemplary schematic cross-sectional views illustrating a method for manufacturing the memory cell array 11 according to the first embodiment.

As illustrated in FIG. 6, a first memory hole MH1 is formed by RIE or a similar method. The first memory hole MH1 passes through a laminated body, which is formed of the conducting layers 21 and interlayer insulating layers 22.

Figure 7:
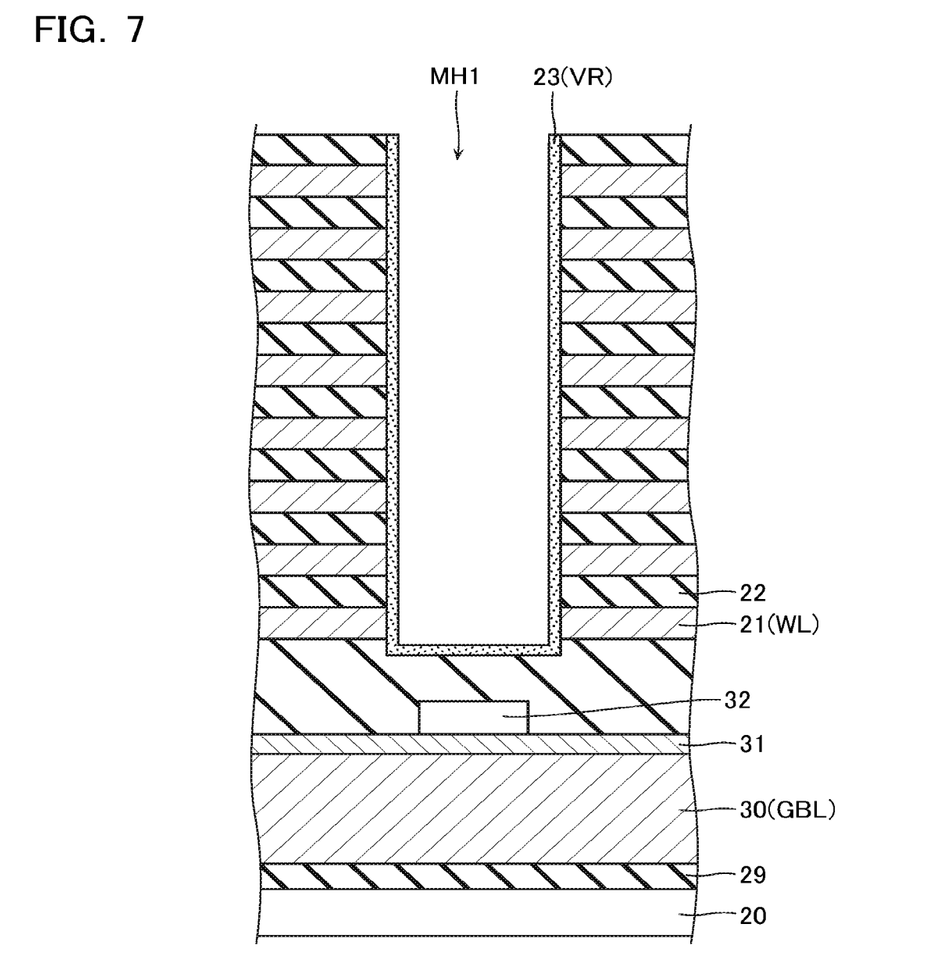

As illustrated in FIG. 7, a metal oxide film, such as hafnium oxide (HfOx), is formed along the inner wall of the first memory hole MH1 by a CVD method or a similar method. This forms the variable resistance film 23.

Figure 8:
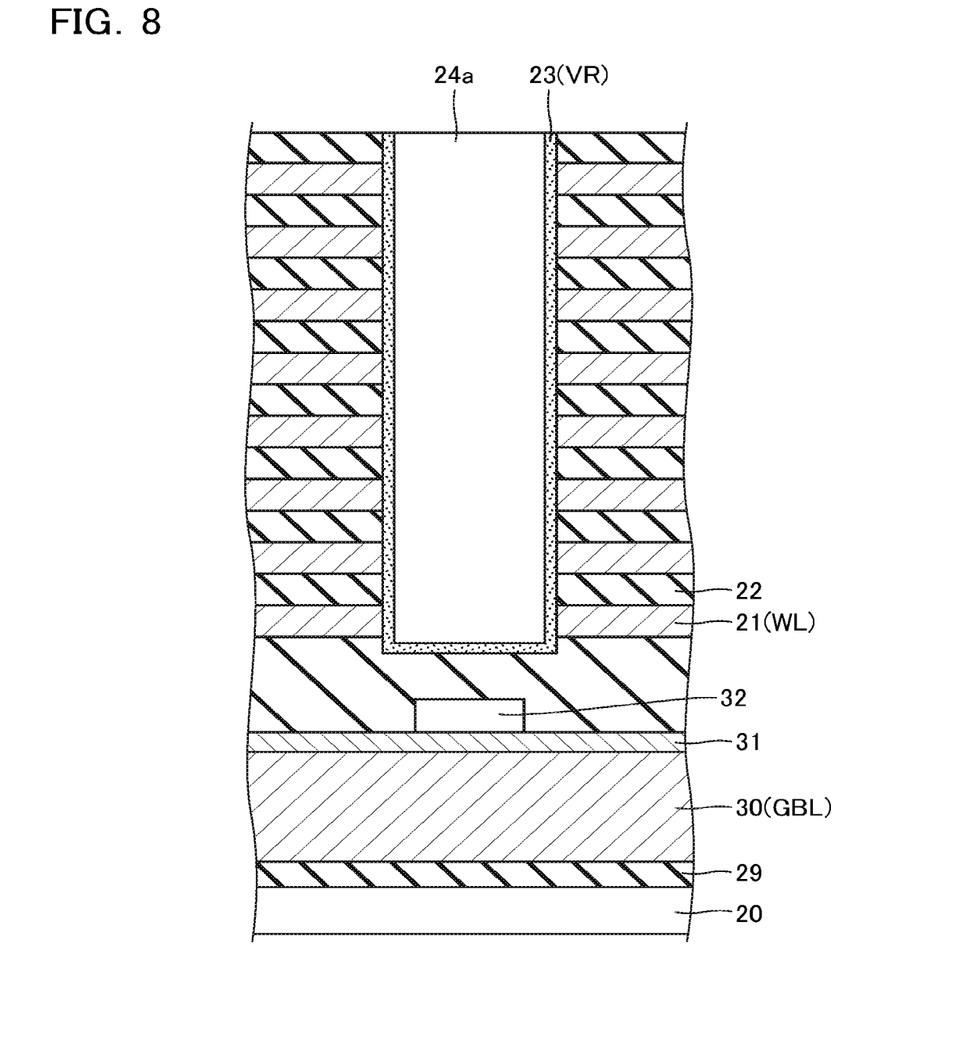

As illustrated in FIG. 8, a film is formed with polysilicon to which impurities are not injected or N− type polysilicon to which, for example, phosphorus (P) has been injected by the CVD method or a similar method. This forms a semiconductor layer 24a.

Figure 9:
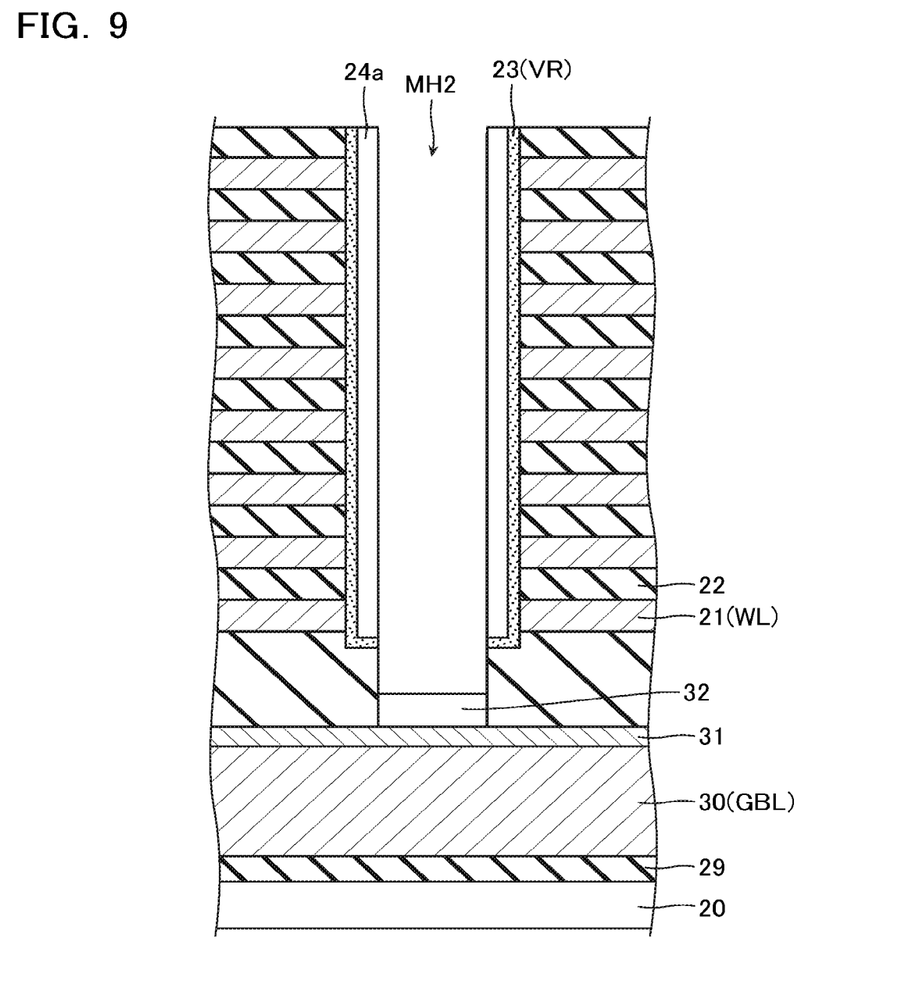

As illustrated in FIG. 9, a second memory hole MH2 is formed by RIE or a similar method so as to pass through the semiconductor layer 24a. The second memory hole MH2 reaches the top surface of the conducting layer 32 and has a width in the Y direction approximately identical to the width of the conducting layer 32 in the X direction. In this respect, the width of the memory hole MH2 in the Y direction is not always necessary to be approximately identical to the width of the conducting layer 32 in the Y direction.

Figure 10:
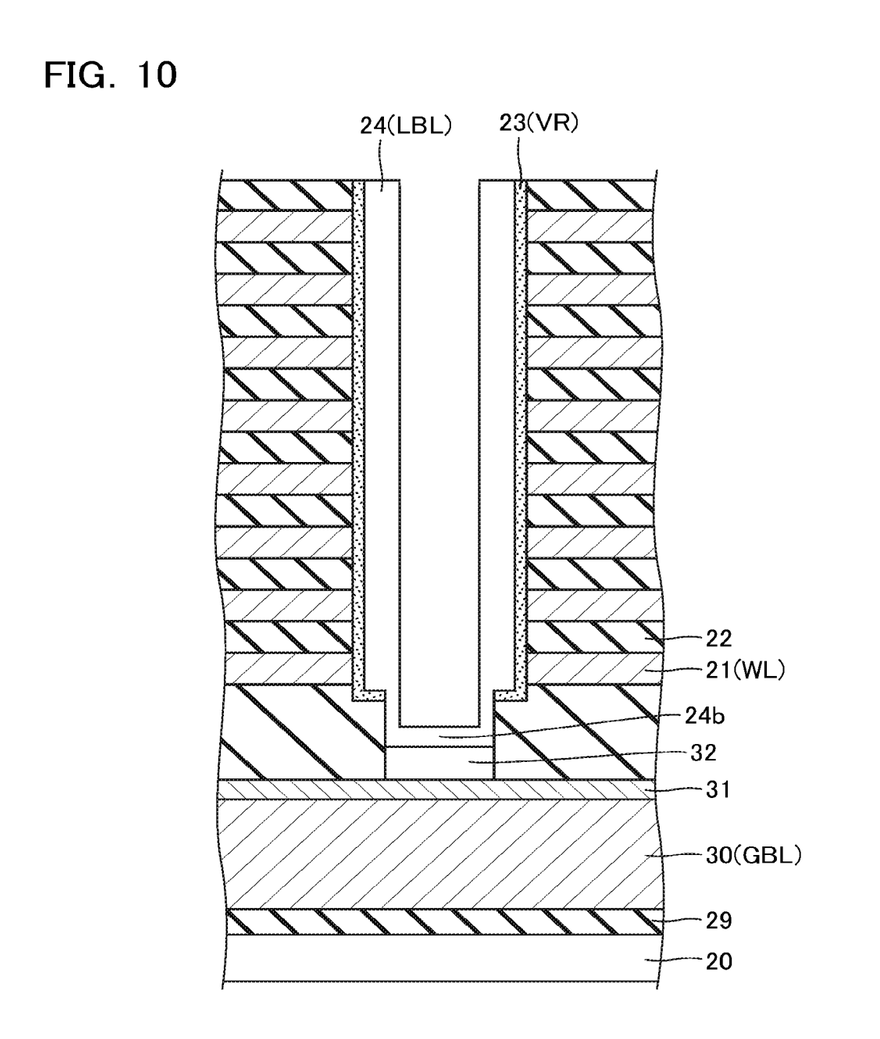

As illustrated in FIG. 10, along the inner sidewall of the second memory hole MH2, a semiconductor layer 24b is formed by the CVD method or a similar method. This semiconductor layer 24b uses the material identical to the semiconductor layer 24a, which is described in the process of FIG. 8. This forms the semiconductor layer 24 opposed to the side surfaces of the conducting layers 21 and has an approximately U shape viewed in the Y-Z plane.

Figure 11:
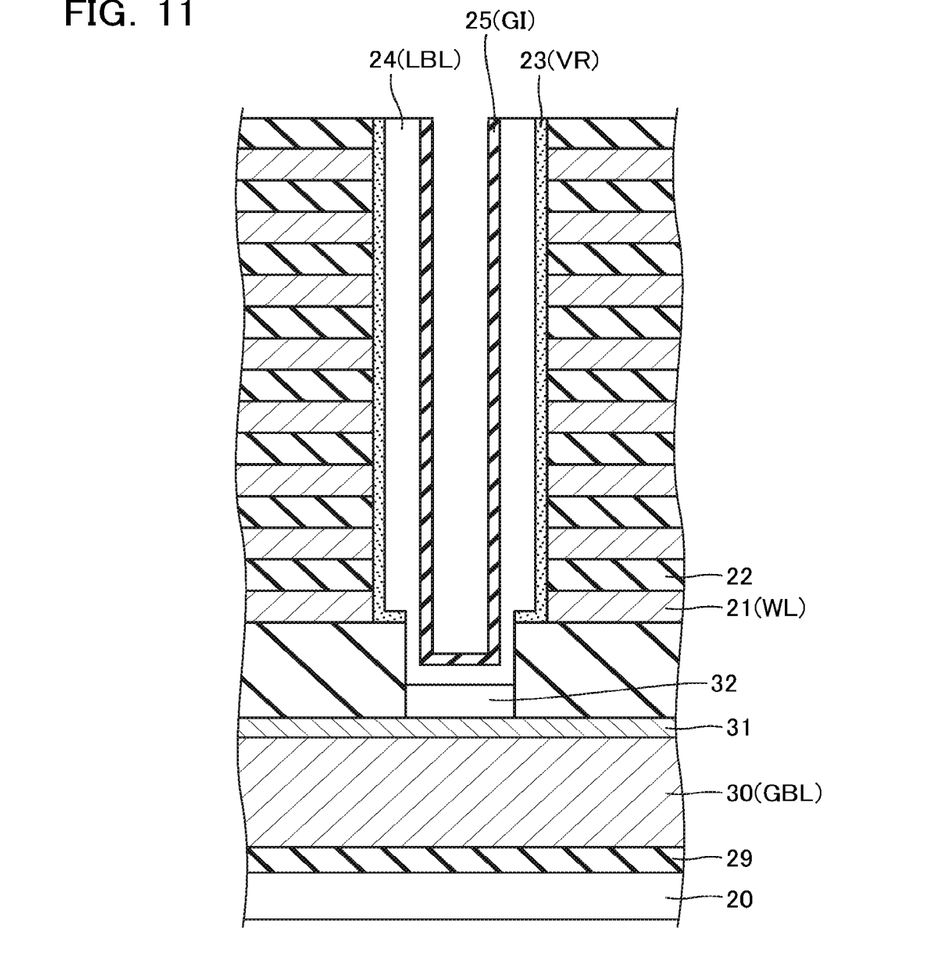

As illustrated in FIG. 11, a film made of an insulating material, such as silicon oxide (SiO$_2$), is formed along the inner sidewall of the semiconductor layer 24 by the CVD or a similar method. This forms a gate insulating layer 25.

Finally, N+ type polysilicon or titanium nitride, or a similar material, and tungsten (W) are sequentially formed. This forms the conducting layer 26, the barrier layer 27, and the conducting layer 28. A film is formed with the insulating material such as silicon oxide (SiO) to obtain the constitution in FIG. 5.

Thus, the processes for forming the memory holes and forming the semiconductor layers are divided into two phases. This allows forming the semiconductor layer 24 as illustrated in FIG. 5 whose widths (diameters) differ in the Y direction.

[Modification]

Figure 12:
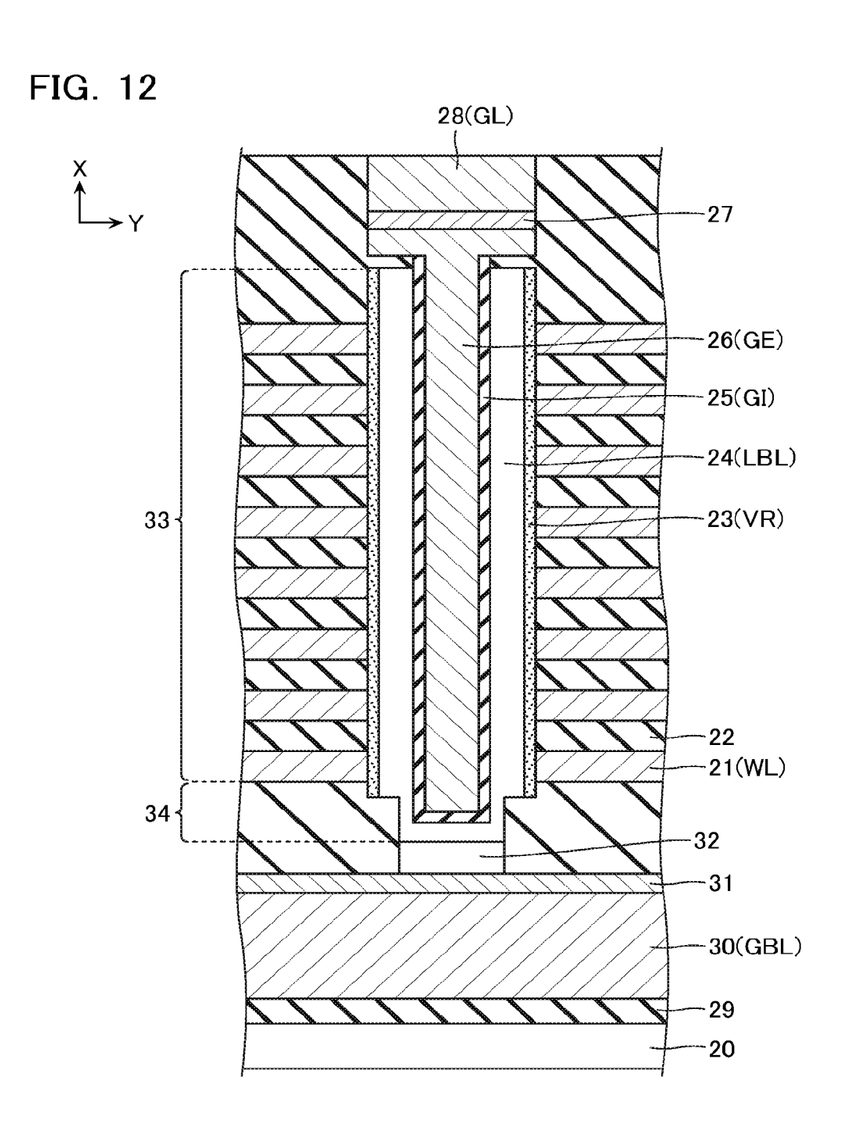
FIG. 12 and FIG. 13 are exemplary schematic cross-sectional views illustrating the configuration of the memory cell array 11 according to modifications.
Figure 13:
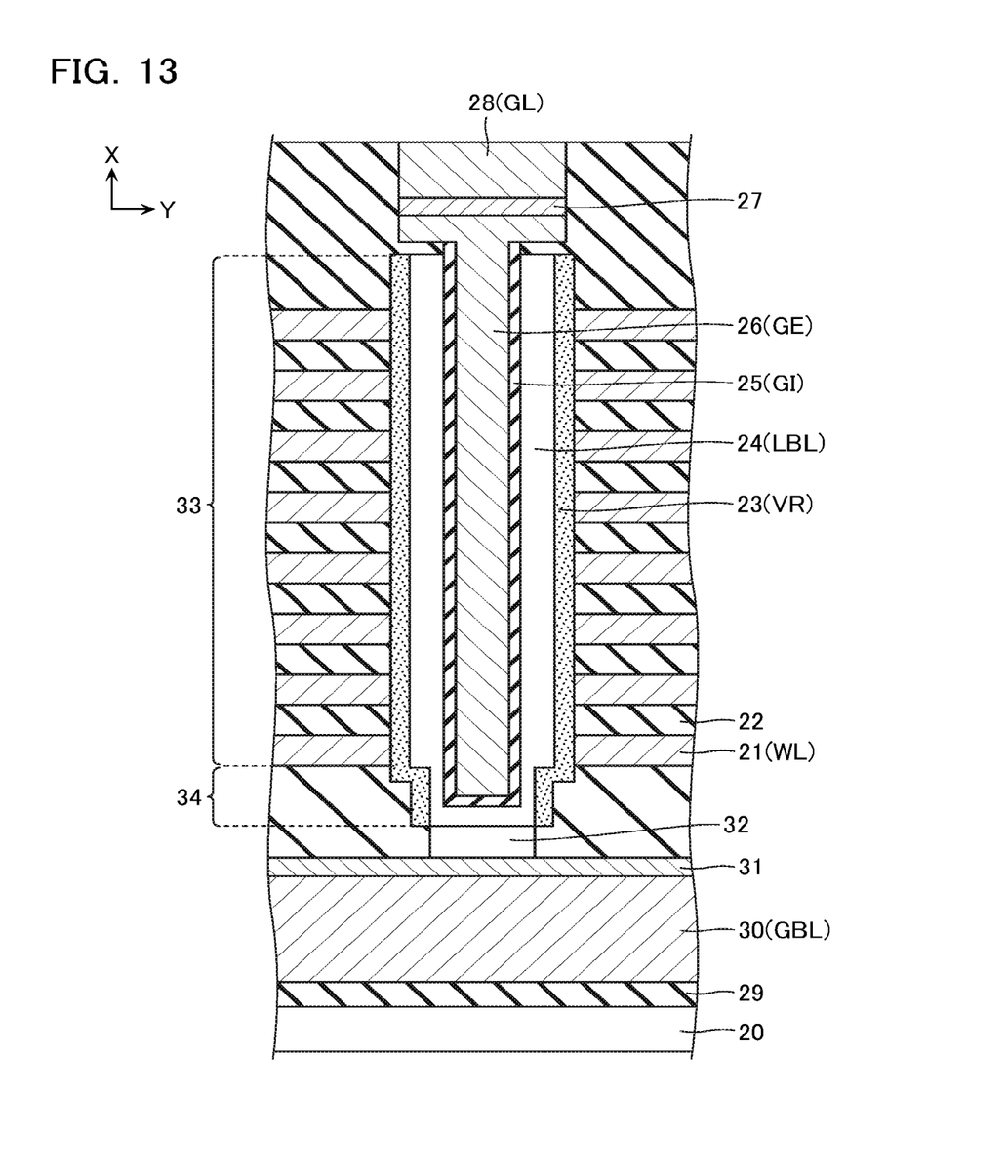

The following describes configurations of nonvolatile semiconductor memory devices according to modifications with reference to FIG. 12 and FIG. 13.

As illustrated in FIG. 5 and similar drawings, the above-described first embodiment disposes the variable resistance film 23 across the side surfaces and the bottom portions of the first part 33 of the semiconductor layer 24. However, the modification illustrated in FIG. 12 disposes the variable resistance film 23 only on the side surfaces of the first part 33 of the semiconductor layer 24, but not on the bottom portions.

The modification illustrated in FIG. 13 disposes the variable resistance film 23 not only on the side surfaces and the bottom portions of the first part 33 of the semiconductor layer 24 but also on the side surfaces of the second part 34. That is, the variable resistance film 23 is disposed across the boundary of the first part 33 and the second part 34 of the semiconductor layer 24. In other words, the variable resistance film 23 extends from the sidewall of the first part 33 to the sidewall of the second part 34 of the semiconductor layer 24.

The nonvolatile semiconductor memory devices according to all the above-described modifications can obtain effects similar to the nonvolatile semiconductor memory device according to the first embodiment.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the above-described embodiment describes the configuration with the so-called normally-off configuration. In the normally-off configuration, the nonvolatile semiconductor memory device is in the Off state while a voltage is not applied to the local bit line LBL, which is the channel, and in the On state while the voltage is applied. However, for example, in the case where the voltage can be independently applied to the respective local bit lines LBL or a similar case, a so-called normally-on configuration where the nonvolatile semiconductor memory device is in the Off state while the voltage is applied to the local bit line LBL also can be used.

What is claimed is:

1. A nonvolatile semiconductor memory device, comprising:
a plurality of conducting layers laminated in a first direction to a surface of a substrate at predetermined pitches, the plurality of conducting layers extending in a second direction along the surface of the substrate;
a semiconductor layer extending in the first direction;
a variable resistive element disposed at an intersection point between the plurality of conducting layers and the semiconductor layer;
a first wiring opposed to an inside of the semiconductor layer via a gate insulating film, the first wiring extending in the first direction; and
a second wiring extending in the second direction, the second wiring being electrically connected to an upper portion of the first wiring, wherein:
the semiconductor layer at least includes a first part and a second part, the first part of the semiconductor layer being upward of a conducting layer on a lowermost layer of the plurality of the conducting layers, the second part of the semiconductor layer being downward of the first part of the semiconductor layer,
the first part of the semiconductor layer has a first length in a third direction, the third direction being intersecting the first direction and the second direction, and along the surface of the substrate, and
the second part of the semiconductor layer has a second length in the third direction, the second length of the second part of the semiconductor layer being shorter than the first length of the first part of the semiconductor layer.

2. The nonvolatile semiconductor memory device according to claim 1, wherein
the semiconductor layer has a columnar shape surrounding a peripheral area of the first wiring.

3. The nonvolatile semiconductor memory device according to claim 1, wherein
the first wiring, the gate insulating film, and the semiconductor layer configure a transistor, the transistor including the first wiring as a gate and the semiconductor layer as a channel.

4. The nonvolatile semiconductor memory device according to claim 1, wherein:
a plurality of first wirings is disposed along the second direction, the plurality of first wirings extending in the semiconductor layer and the inside of the semiconductor layer, and
the second wiring is electrically connected in common to the plurality of first wirings, the plurality of first wirings being disposed along the second direction.

5. The nonvolatile semiconductor memory device according to claim 4, wherein
the second length of the second part of the semiconductor layer is greater than a length in the third direction, the length in the third direction being an addition of the first wiring and the gate insulating film.

6. The nonvolatile semiconductor memory device according to claim 1, further comprising:
a third wiring electrically connected to a lower end of the semiconductor layer, the third wiring extending in the third direction.

7. The nonvolatile semiconductor memory device according to claim 6, wherein
the third wiring is made of metal, and
a connection between the lower end of the semiconductor layer and the third wiring being an ohmic contact.

8. The nonvolatile semiconductor memory device according to claim 1, wherein
a conducting layer of the plurality of conducting layers has a comb shape viewed from the first direction.

9. The nonvolatile semiconductor memory device according to claim 1, wherein
the variable resistive element is disposed across a sidewall of the first part of the semiconductor layer to a sidewall of the second part of the semiconductor layer.

10. The nonvolatile semiconductor memory device according to claim 1, wherein
a lower end of the variable resistive element extends in the third direction at a bottom portion of the first part of the semiconductor layer.

11. The nonvolatile semiconductor memory device according to claim 1, wherein
the first wiring contains polysilicon, and the second wiring contains metal.

12. The nonvolatile semiconductor memory device according to claim 11, wherein
a connection between the first wiring and the second wiring is an ohmic contact.

* * * * *